US012648189B2

(12) United States Patent
Tung et al.

(10) Patent No.: US 12,648,189 B2
(45) Date of Patent: Jun. 2, 2026

(54) METHOD OF FORMING SEMICONDUCTOR STRUCTURE HAVING ELECTRICALLY CONDUCTIVE STRUCTURE

(71) Applicant: Fujian Jinhua Integrated Circuit Co., Ltd., Quanzhou City (CN)

(72) Inventors: Yu-Cheng Tung, Quanzhou City (CN); Yun-Fan Chou, Quanzhou City (CN); Te-Hao Huang, Quanzhou City (CN); Hsien-Shih Chu, Quanzhou City (CN); Feng-Ming Huang, Quanzhou City (CN)

(73) Assignee: Fujian Jinhua Integrated Circuit Co., Ltd., Quanzhou City (CN)

( * ) Notice: Subject to any disclaimer, the term of this patent is extended or adjusted under 35 U.S.C. 154(b) by 524 days.

(21) Appl. No.: 18/140,595

(22) Filed: Apr. 27, 2023

(65) Prior Publication Data

US 2023/0261046 A1 Aug. 17, 2023

Related U.S. Application Data

(62) Division of application No. 17/465,803, filed on Sep. 2, 2021, now Pat. No. 11,688,764, which is a division (Continued)

(30) Foreign Application Priority Data

Jul. 2, 2019 (CN) .......................... 201910591043.4

(51) Int. Cl.
H10D 62/10 (2025.01)
H10W 10/00 (2026.01)
(Continued)

(52) U.S. Cl.
CPC ........ H10D 62/115 (2025.01); H10W 10/014 (2026.01); H10W 10/17 (2026.01);
(Continued)

(58) Field of Classification Search
CPC ............. H10D 62/115; H10D 84/0135; H10D 84/0151; H10D 84/038; H10D 84/83;
(Continued)

(56) References Cited

U.S. PATENT DOCUMENTS 6,147,378 A * 11/2000 Liu .................... H10D 30/0411
257/305
2005/0167778 A1* 8/2005 Kim .................. H01L 21/76224
257/E21.546

(Continued)

FOREIGN PATENT DOCUMENTS

CN 107134486 A * 9/2017 ....... H01L 21/76895

*Primary Examiner* — Mohammad M Hoque
(74) *Attorney, Agent, or Firm* — Winston Hsu

(57) ABSTRACT

A semiconductor structure and a method of forming the semiconductor structure are disclosed. Through forming an electrically conductive structure on a trench isolation structure, utilization of a space above the trench isolation structure is achievable, which can reduce the space required in a semiconductor integrated circuit to accommodate the electrically conductive structure, thus facilitating dimensional shrinkage of the semiconductor integrated circuit.

12 Claims, 3 Drawing Sheets

Related U.S. Application Data of application No. 16/635,208, filed as application No. PCT/CN2019/124588 on Dec. 11, 2019, now Pat. No. 11,145,715.

(51) Int. Cl.

| | |
|---|---|
| *H10W 10/17* | (2026.01) |
| *H10D 84/01* | (2025.01) |
| *H10D 84/03* | (2025.01) |
| *H10D 84/83* | (2025.01) |

(52) U.S. Cl.
CPC ..... *H10D 84/0135* (2025.01); *H10D 84/0151* (2025.01); *H10D 84/038* (2025.01); *H10D 84/83* (2025.01)

(58) Field of Classification Search
CPC ......... H01L 21/76224; H01L 21/28123; H01L 21/76229; H01L 21/76237; H01L 21/76897
USPC .......................................................... 257/506
See application file for complete search history.

(56) References Cited

U.S. PATENT DOCUMENTS

| | | | | |
|---|---|---|---|---|
| 2007/0173003 | A1 | 7/2007 | Hierlemann | |
| 2007/0173005 | A1* | 7/2007 | Lee ........................ | H10B 99/22 257/E29.283 |
| 2009/0020809 | A1 | 1/2009 | Kitamura | |
| 2018/0097020 | A1 | 4/2018 | Lv | |
| 2018/0175143 | A1* | 6/2018 | Yoon ................. | H01L 21/76224 |

* cited by examiner

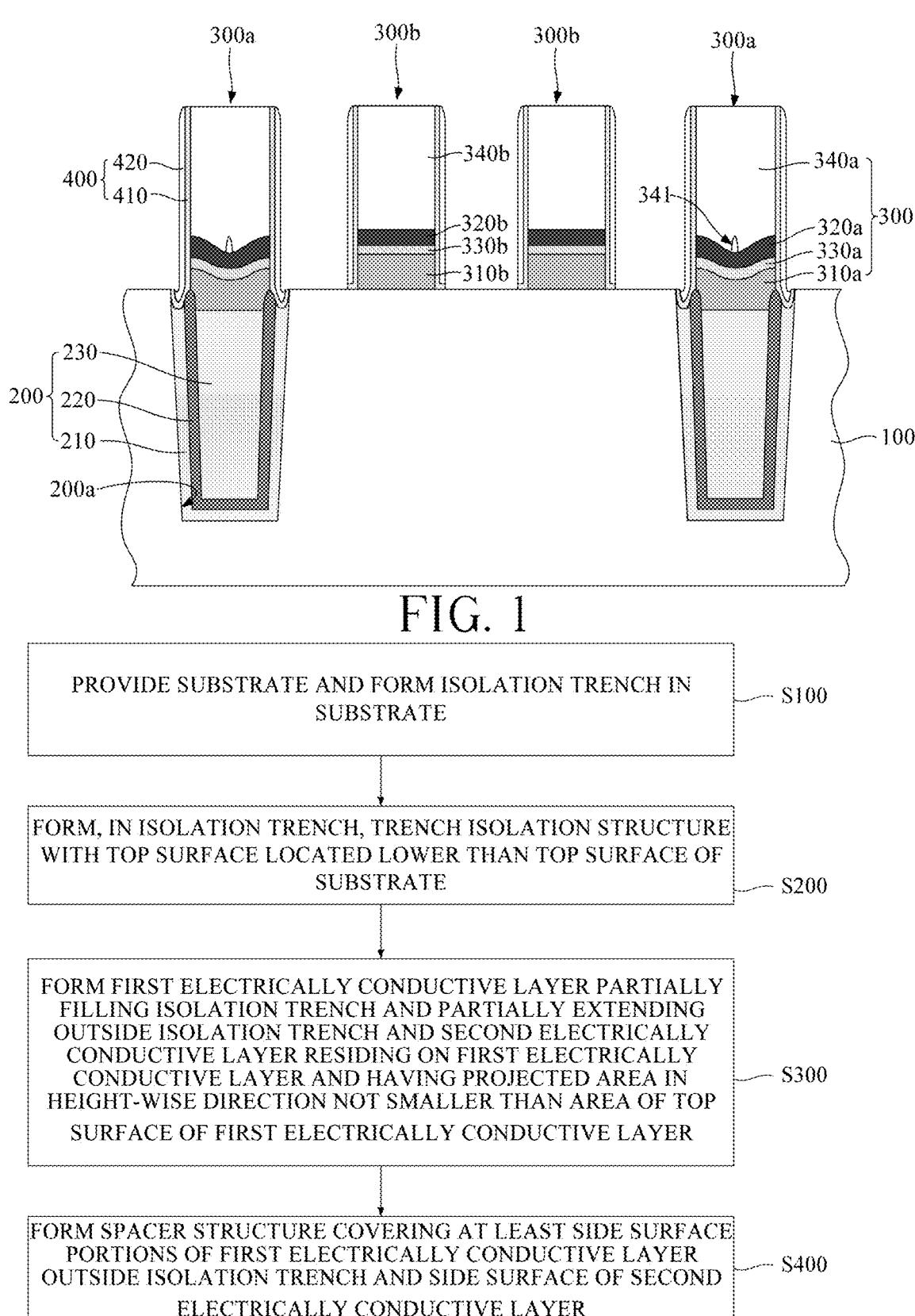

FIG. 1

PROVIDE SUBSTRATE AND FORM ISOLATION TRENCH IN SUBSTRATE — S100

FORM, IN ISOLATION TRENCH, TRENCH ISOLATION STRUCTURE WITH TOP SURFACE LOCATED LOWER THAN TOP SURFACE OF SUBSTRATE — S200

FORM FIRST ELECTRICALLY CONDUCTIVE LAYER PARTIALLY FILLING ISOLATION TRENCH AND PARTIALLY EXTENDING OUTSIDE ISOLATION TRENCH AND SECOND ELECTRICALLY CONDUCTIVE LAYER RESIDING ON FIRST ELECTRICALLY CONDUCTIVE LAYER AND HAVING PROJECTED AREA IN HEIGHT-WISE DIRECTION NOT SMALLER THAN AREA OF TOP SURFACE OF FIRST ELECTRICALLY CONDUCTIVE LAYER — S300

FORM SPACER STRUCTURE COVERING AT LEAST SIDE SURFACE PORTIONS OF FIRST ELECTRICALLY CONDUCTIVE LAYER OUTSIDE ISOLATION TRENCH AND SIDE SURFACE OF SECOND ELECTRICALLY CONDUCTIVE LAYER — S400

METHOD OF FORMING SEMICONDUCTOR STRUCTURE HAVING ELECTRICALLY CONDUCTIVE STRUCTURE

CROSS REFERENCE TO RELATED APPLICATIONS

This application is a division of U.S. application Ser. No. 17/465,803, filed on Sep. 2, 2021, which is a division of U.S. application Ser. No. 16/635,208, filed on Jan. 30, 2020. The contents of these applications are incorporated herein by reference.

BACKGROUND OF THE INVENTION

1. Field of the Invention

The present invention relates to the field of semiconductor technology, and in particular, to a semiconductor structure and a method of fabricating the semiconductor structure.

2. Description of the Prior Art

Shallow trench isolations (STIs) are primary means currently adopted in the field of large-scale integration to isolate components. For example, a trench isolation structure can be used to isolate adjacent active areas (AAs) from each other in order to prevent crosstalk between components formed in the different active areas. In addition, a semiconductor integrated circuit usually further includes a large number of electrically conductive structures for, for example, enabling electrical transmission or acting as dummy components (i.e., not performing electrical functions). In generally, electrically conductive structures in an integrated circuit are offset from the trench isolation structures. Therefore, it is necessary to reserve spaces for accommodating the electrically conductive structures.

Contrary to the development trend of semiconductor technology toward increasing miniaturization of integrated circuits, dimensional shrinkage of electrically conductive structures is limited in ability to reduce the overall size of a semiconductor integrated circuit due to the necessity of the considerable reserved spaces.

SUMMARY OF THE INVENTION

It is an objective of the present invention to provide a semiconductor structure allowing a reduction in the overall size of a semiconductor integrated circuit in which the semiconductor structure is employed.

To this end, the provided semiconductor structure includes: a trench isolation structure formed in an isolation trench in a substrate, the trench isolation structure including a plurality of insulating layers sequentially stacked over an inner surface of the isolation trench, an innermost layer of the plurality of insulating layers having a top surface lower than a top surface of the substrate so that a first groove is formed in the isolation trench; and an electrically conductive structure formed on the substrate and located at least partially on the trench isolation structure, the electrically conductive structure completely filling the first groove, the electrically conductive structure including a first conductive layer and a second conductive layer, the first conductive layer filling the first groove and extending upward beyond the isolation trench, the second conductive layer being formed on the first conductive layer.

Based on the above semiconductor structure, the present invention also provides a method of forming a semiconductor structure, including: providing a substrate and forming an isolation trench in the substrate; forming a plurality of insulating layers in the isolation trench to form a trench isolation structure, wherein a top surface of an innermost layer of the plurality of insulating layers is lower than a top surface of the substrate so that a first groove is defined in the isolation trench; and forming a first conductive layer and a second conductive layer over the substrate to form an electrically conductive structure, wherein the first conductive layer completely fills the first groove and extends upward beyond the isolation trench, and wherein the second conductive layer is formed on the first conductive layer.

In the semiconductor structure provided in the invention, though forming the electrically conductive structure at least partially on the trench isolation structure in the substrate, a space above the trench isolation structure can be efficiently utilized. This can reduce the space required to be reserved for the electrically conductive structure or even eliminate the need to reserve such a space, thus helping in dimensional shrinkage of a semiconductor integrated circuit in which the semiconductor structure is employed.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 is a schematic representation of a semiconductor structure according to an embodiment of the present invention.

FIG. 2 is a flowchart of a method of fabricating a semiconductor structure according to an embodiment of the present invention.

DETAILED DESCRIPTION

Figures 3A, 3B:
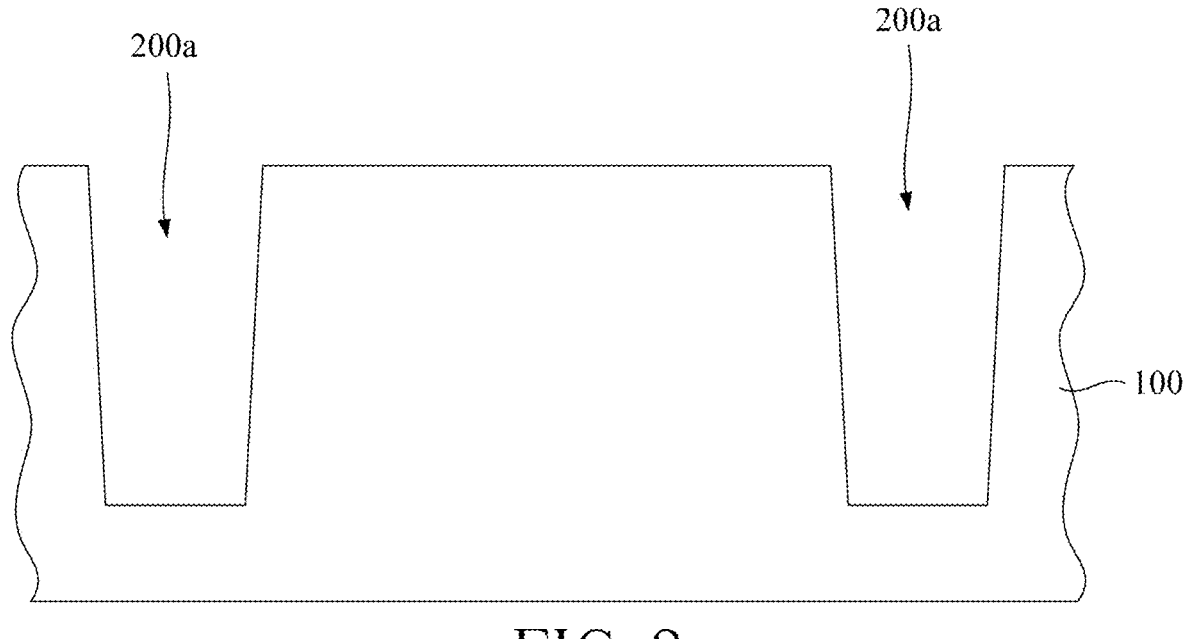
FIGS. 3a to 3d are schematic representations of intermediate structures resulting from steps in a method for fabricating a semiconductor structure according to an embodiment of the present invention.

Specific embodiments of the semiconductor structure and method of fabricating such a semiconductor structure proposed in this invention will be described in greater detail below with reference to the accompanying drawings. Features and advantages of the invention will be more apparent from the following detailed description. Note that the accompanying drawings are provided in a very simplified form not necessarily presented to scale, with their only intention to facilitate convenience and clarity in explaining the embodiments.

FIG. 1 is a schematic representation of a semiconductor structure according to an embodiment of the present invention. As shown in FIG. 1, the semiconductor structure includes: a trench isolation structure 200 formed in an isolation trench 200a in a substrate 100, wherein at least part of a top surface of the trench isolation structure 200 is located lower than a top surface of the substrate 100; and an electrically conductive structure 300 formed on the substrate 100, the electrically conductive structure 300 at least partially overlying the trench isolation structure 200 and filling the isolation trench 200a.

The electrically conductive structure 300 includes a first conductive layer 310a and a second conductive layer 320a.

The first conductive layer 310a partially fills the isolation trench 200a and partially extends upward beyond the isolation trench 200a, and the second conductive layer 320a overlies the first conductive layer 310a. According to this embodiment, as the first conductive layer 310a partially extends upward beyond the isolation trench 200a, a top surface of the first conductive layer 310a is located wholly higher than the top surface of the substrate 100.

It is to be noted that forming the electrically conductive structure 300 on the trench isolation structure 200 allows efficient utilization of a space over the trench isolation structure 200 and thus reduces a reserved space for the electrically conductive structure or dispenses with the need to reserve a space for the electrically conductive structure 300. This is helpful in reducing the overall size of an integrated circuit in which the semiconductor structure is deployed.

It is to be also noted that the performance of the electrically conductive structure 300 formed on the trench isolation structure 200 will not be considerably affected although it is partially embedded in the isolation trench 200a. For example, when the electrically conductive structure 300 is used for electrical transmission, despite that it is partially filled in the isolation trench 200a, desired electrical transmission performance can be still ensured by the first conductive layer 310a and the second conductive layer 320a. Alternatively, when the electrically conductive structure 300 is used as a dummy component such as, for example, a dummy gate, whether its performance is impaired will not be a problem because no electrical function is expected from it.

According to this embodiment, the second conductive layer 320a may have a projected area in the height-wise direction that is not smaller than the area of the top surface of the first conductive layer 310a. As such, the top surface of the first conductive layer 310a can be covered directly or indirectly by the second conductive layer 320a and not exposed in this direction so that only the side surfaces of the first conductive layer 310a are laterally exposed with respect to the second conductive layer 320a. Materials from which the first conductive layer 310a can be fabricated may, for example, include doped polysilicon, while the second conductive layer 320a may be a metal layer fabricated from a material such as, for example, tungsten (W).

Additionally, the trench isolation structure 200 includes a plurality of insulating layers stacked one on another over an inner surface of the isolation trench 200a, and the innermost one of the multiple insulating layers has a top surface located lower than the top surface of the substrate so that a first groove is formed in the isolation trench 200a.

According to this embodiment, a boundary of the side surface of the electrically conductive structure 300 is located between a boundary of the first groove and a boundary of the isolation trench 200a so that the electrically conductive structure 300 fills up the first groove. That is, at least part of the first conductive layer 310a in the electrically conductive structure 300 may be formed on the innermost insulating layer so as to fully fill the first groove, with the remainder thereof extending above and outside the isolation trench 200a. It is to be noted that, the "side surfaces of the electrically conductive structure serving as lateral boundaries thereof" are meant to refer to the side surfaces thereof extending along its longitudinal direction.

With continued reference to FIG. 1, according to this embodiment, the multiple insulating layers in the trench isolation structure 200 may include a first insulating layer 210, a second insulating layer 220 and a third insulating layer 230. The first insulating layer 210 and the second insulating layer 220 are sequentially and conformally stacked over the inner surface of the isolation trench 200a, and the third insulating layer 230 is the innermost one of the multiple insulating layers and fills up the isolation trench 200a. In other words, the second insulating layer 220 is sandwiched between the first insulating layer 210 and the third insulating layer 230 that is the innermost component of the trench isolation structure 200. Moreover, a top surface of the third insulating layer 230 is lower than top edges of the isolation trench 200a so that the third insulating layer 230 is also lower than the top surface of the substrate 100.

Additionally, the top surface of the third insulating layer 230 may be also lower than a top surface of the second insulating layer 220 so that the first groove is delimited over the third insulating layer 230 by the second insulating layer 220.

With continued reference to FIG. 1, the side surfaces of the electrically conductive structure 300 serving as lateral boundaries thereof may be located beyond respective side surfaces of the third insulating layer 230 serving as lateral boundaries thereof and come into contact with the second insulating layer 220. It would be appreciated that, in a predetermined direction, a width of the electrically conductive structure 300 is greater than an opening size of the first groove delimited by the second insulating layer and smaller than a width of the trench isolation structure 200.

According to this embodiment, the first conductive layer 310a in the electrically conductive structure 300 fills up the first groove delimited by the second insulating layer 220 so as to cover the third insulating layer 230 as well as side surface portions of the second insulating layer 220 close to the third insulating layer. Additionally, the first conductive layer 310a also extends upward beyond the first groove so that its side surfaces serving as laterally boundaries thereof come into contact with respective tops of the second insulating layer 220 and that the first conductive layer 310a itself also has side surface portions outside the first groove.

According to an alternative embodiment, a top surface of the first insulating layer 210 may also be located lower than both top surfaces of the second insulating layer 220 and the substrate 100 so that side surface portions of the second insulating layer 220, side surface portions of the isolation trench 200a and the top surface portions of the first insulating layer 210 together delimit small second grooves between the respective side surface portions of the second insulating layer 220 and the respective side surface portions of the isolation trench.

In this way, for example, the first and third insulating layers 210, 230 can be fabricated from the same material, while the second insulating layer 220 can be fabricated from a material different from that of the third insulating layer 230. As a result, during an etch-back process employed in the formation of the trench isolation structure 200, it is possible to make both the top surfaces of the first and third insulating layers 210, 230 lower than the top surface of the substrate 100. Additionally, when the second insulating layer 220 is made of a different material from that of the third insulating layer 230, the etch-back process can make both the top surfaces of the first and third insulating layers 210, 230 also lower than the top surface of the second insulating layer 220.

In particular, materials from which the first and third insulating layers 210, 230 can be fabricated may include, for example, silicon oxide (SiO), while materials from which the second insulating layer 220 can be fabricated may include, for example, silicon nitride (SiN). As such, the trench isolation structure 200 will be of an ONO structure that is helpful in improving the isolation performance of the trench isolation structure 200.

With continued reference to FIG. 1, the semiconductor structure may further include a spacer structure 400, the spacer structure 400 covers at least the side surfaces of the electrically conductive structure 300. As such, the spacer structure 400 covers at least the side surface portions of the first conductive layer 310a extending upward beyond the isolation trench 200a and side surfaces of the second conductive layer 320a.

According to this embodiment, in a predetermined direction, a width of the electrically conductive structure 300 may be greater than a width of the third insulating layer 230 and smaller than a width of the trench isolation structure 200 so that the electrically conductive structure 300 does not cover the second grooves between the respective side surface portions of the second insulating layer and the respective side surface portions of the isolation trench. On basis of this, the spacer structure 400 may further extend into the second grooves so as to cover both the second and first insulating layer 220, 210. In other words, the spacer structure 400 may fill up the second grooves so as to eliminate the gaps around edges of the isolation trench 200a.

The spacer structure 400 may be either a single-layer structure or a laminated structure. According to this embodiment, the spacer structure 400 include a first isolation layer 410 and a second isolation layer 420, the first and second isolation layers 410, 420 are sequentially stacked on the side surfaces of the electrically conductive structure 300 and fill up the second grooves in geometric conformity with the second insulating layer 220. In particular, the first and second isolation layers 410, 420 may be formed of different materials. For example, materials from which the first isolation layer 410 can be fabricated may include silicon oxide, while materials from which the second isolation layer 420 can be fabricated may include silicon nitride.

Of course, in other embodiments, the spacer structure may alternatively include three isolation layers laminated one on another on the side surfaces of the electrically conductive structure. Moreover, the three isolation layers in the spacer structure may be a silicon oxide layer, a silicon nitride layer on the silicon oxide layer and another silicon oxide layer on the silicon nitride layer so that the spacer structure is of an ONO structure.

It would be appreciated that the trench isolation structure 200 defines the first groove in the isolation trench 200a, the isolation trench 200a is filled up by the first conductive layer 310a. Side surfaces of the first conductive layer 310a, which serves as its lateral boundaries, come into contact with top edges of the first groove. Moreover, the trench isolation structure 200 also defines second grooves in the isolation trench 200a, which is located beside the first groove and can be filled by the spacer structure 400 so as to eliminate the gaps around edges of the isolation trench 200a.

Specifically, with particular reference to FIG. 1 in combination with the above description, since the side surfaces of the first conductive layer 310a serving as lateral boundaries thereof come into contact with the tops edges of the first groove, a first recess may be formed in a top surface portion of the first conductive layer 310a aligned with the isolation trench 200a (more specifically, the first groove in the top surface portion of the first conductive layer 310a corresponding to the first recess), the first recess has a bottom located above the top edges of the isolation trench 200a. Accordingly, the second conductive layer 320a is located above the first conductive layer 310a. Correspondingly, the bottom surface portion of the second conductive layer 320a corresponding with the isolation trench 200a may be convex toward the first conductive layer 310a. The top surface portion of the second conductive layer 320a corresponding with the isolation trench 200a may be concave toward the first conductive layer 310a to define a second recess.

In other words, according to this embodiment, the first recess in the first conductive layer 310a is positionally corresponding with the second recess in the second conductive layer 320a. More specifically, the bottom of the first recess in the first conductive layer 310a is in correspondence with a bottom of the second recess in the second conductive layer 320a along a single vertical line.

With continued reference to FIG. 1, the electrically conductive structure 300 may further include a third conductive layer 330a, the third conductive layer 330a is disposed between the first conductive layer 310a and the second conductive layer 320a. Materials from which the third conductive layer 330a can be fabricated may include, for example, titanium nitride.

According to this embodiment, the third conductive layer 330a may cover the top surface of the first conductive layer 310a in geometric conformity therewith so that the third conductive layer 330a assumes a shape curved in compliance with the curvature of the first recess in the first conductive layer 310a. In other words, a bottom portion of the curved third conductive layer 330a corresponding with the first recess may protrude into the first recess, and a top surface portion of the third conductive layer 330a corresponding with the first recess is concave toward the first conductive layer 310a and thus defines a third recess. In addition, a portion of the second conductive layer 320a near the third conductive layer may protrude into the third recess.

With continued reference to FIG. 1, the electrically conductive structure 300 may further include a masking layer 340a, the masking layer 340a is formed on the second conductive layer 320a and the masking layer 340a has a top surface that is flatter than the top surface of the second conductive layer 320a. Specifically, the flat top surface of the masking layer 340a may result from, for example, a planarization process.

Additionally, according to this embodiment, a bottom surface portion of the masking layer 340a corresponding with the second recess may delimit a void 341 together with the second recess. Specifically, the void 341 may be present in the second recess defined by the top surface of the second conductive layer 320a.

With continued reference to FIG. 1, the semiconductor structure according to this embodiment may include at least two of the trench isolation structures 200 as defined above, of which every two adjacent trench isolation structures 200 define an active area (AA) in which semiconductor components can be formed. According to this embodiment, an electrically conductive structure may be formed in the active area. It may also include a first conductive layer, a third conductive layer, a second conductive layer and a masking layer, which are sequentially stacked in this order one on another in the active area.

Specifically, the electrically conductive structure as a semiconductor component may be formed, for example, in order to constitute a gate structure 300b. That is, the gate structure 300b may include a first conductive layer 310b and a second conductive layer 320b. It may further include a third conductive layer 330b and a masking layer 340b.

Further, the gate structure 300b in the active area and the electrically conductive structure 300 in the isolation area (corresponding to the trench isolation structure) may together constitute a semiconductor integrated circuit such as, for example, a peripheral circuit in a memory device. The gate structure 300b in the active area may, for example, constitute a switching transistor in the peripheral circuit. The electrically conductive structure 300 in the isolation area may be configured, for example, for electrical transmission or as a dummy gate structure.

As discussed above, when the electrically conductive structure 300 in the isolation area is adapted for electrical transmission, despite that the bottom portion of the electrically conductive structure 300 is seated in the isolation trench 200a, the first conductive layer 310a and the second conductive layer 320a in the electrically conductive structure 300 can still ensure satisfactory electrical transmission performance. Additionally, according to this embodiment, the electrically conductive structure 300 in the isolation area may be made narrower than the isolation trench 200a, in order to avoid the electrically conductive structure 300 from extending into the active area and possibly cross talking with any semiconductor component in the active area.

A further detailed description will be given below with the electrically conductive structure 300 in the isolation area being a dummy gate structure 300a as an example.

As shown in FIG. 1, the gate structure 300b is formed on the top surface of the substrate 100, and a top surface of the first conductive layer 310b in the gate structure 300b is flatter than that of the first conductive layer 310a in the dummy gate structure 300a. Accordingly, the top surfaces of the third and second conductive layer 330b, 320b in the gate structure 300b are also flatter than those of the third and second conductive layer 330a, 320a in the dummy gate structure 300a.

Additionally, in the gate structure 300b, the bottom surface of the masking layer 340b is brought into solid contact with the top surface of the second conductive layer 320b, without any void present in the masking layer 340b of the gate structure 300b.

Further, the top surface of the first conductive layer 310b in the gate structure 300b is located above the top surface of the first conductive layer 310a in the dummy gate structure 300a. Accordingly, the third conductive layer 330b in the gate structure 300b is located higher than the third conductive layer 330a in the dummy gate structure 300a. Moreover, the second conductive layer 320b in the gate structure 300b is located above the second conductive layer 320a in the dummy gate structure 300a. However, it is to be noted that, according to this embodiment, the top surface of the masking layer 340b in the gate structure 300b may be alternatively aligned with the top surface of the masking layer 340a in the dummy gate structure 300a. In other words, the top surfaces of the masking layers respectively above the trench isolation structure and the active area may be coplanar with each other.

Based on the semiconductor structure as defined above, in an embodiment, there is provided a method of fabricating a semiconductor structure, as shown in the flowchart of FIG. 2. As shown in FIG. 2, the method of fabricating a semiconductor structure includes the steps of: S100) providing a substrate and forming an isolation trench in the substrate; S200) forming a trench isolation structure in the isolation trench, wherein at least part of a top surface of the trench isolation structure is located lower than a top surface of the substrate; and S300) forming a first conductive layer and a second conductive layer over the substrate, wherein the first conductive layer partially fills the isolation trench and partially extends upward beyond the isolation trench, and wherein the second conductive layer overlies the first conductive layer.

FIGS. 3a to 3d are schematic illustrations of intermediate structures resulting from steps in a method of fabricating a semiconductor structure according to an embodiment of the present invention. The steps in the method will be described in detail below with reference to the figures.

In step S100, with particular reference to FIG. 3a, a substrate 100 is provided and an isolation trench 200a is formed in the substrate 100.

The formation of the isolation trench 200a may include, for example: forming a mask layer (not shown) in the substrate 100; patterning the mask layer to define a location where the isolation trench is to be formed; and forming the isolation trench 200a by etching the substrate 100 with the mask layer serving as a mask.

With particular reference to FIG. 3a, according to this embodiment, the isolation trench 200a is tapered from the top to the bottom so as to have inclined inner side surfaces. Forming the isolation trench 200a with these inclined inner side surfaces are helpful in subsequently filling an insulating material in the isolation trench 200a with high quality and without voids present in the insulating material filled in the isolation trench 200a.

In step S200, with particular reference to FIG. 3b, a trench isolation structure 200 is formed in the isolation trench 200a so that at least a top surface of the trench isolation structure 200 is located lower than a top surface of the substrate 100.

It is to be noted that a conventional trench isolation structure is often formed using a planarization process in such a manner that a top surface of the trench isolation structure is flush with, or even protrudes out of (i.e., above), a top surface of a substrate in which the trench isolation structure is formed.

By contrast, according to this embodiment, the trench isolation structure 200 is formed by forming multiple insulating layers in the isolation trench 200a with the aid of etching processes and at least a top surface of the innermost one of the insulating layers in the trench isolation structure 200 is lowered so that the resulting trench isolation structure 200 is recessed relative to the top surface of the substrate 100.

Specifically, the formation of the trench isolation structure 200 may include the following steps, for example.

In a first step, a first insulating material layer and a second insulating material layer are successively deposited over the substrate 100 so that the first and second insulating material layers cover both an inner surface of the isolation trench 200a (including its bottom and side sections) in geometric conformity therewith and the top surface of the substrate 100.

According to this embodiment, examples of the first insulating material layer may include a silicon oxide layer, while examples of the second insulating material layer may include a silicon nitride layer. The silicon oxide layer may be formed by an oxidation process, whist the silicon nitride layer may be formed by a chemical vapor deposition process.

In a second step, a third insulating material layer is deposited over the substrate 100, which covers the second insulating material layer and fills up the isolation trench 200a. Materials from which the third insulating material layer can be fabricated may include, for example, silicon oxide.

In a third step, an etching process is performed on the third, second and first insulating material layers to remove their portions formed above the top surface of the substrate so that the remainders of them within the isolation trench constitute respective third, second and first insulating layers 230, 220, 210 and that a top surface of the third insulating layer 230 is located below the top surface of the substrate 100.

Specifically, in the etching process, the portions of the topmost third insulating material layer formed over the top surface of the substrate may be first etched away by the used etchant until the underlying second insulating material layer is exposed. Next, the portion of the second insulating material layer formed over the top surface of the substrate may be removed so that the remainder thereof deposited within the isolation trench 200a constitutes the second insulating layer 220. Afterward, the exposed first insulating material layer may be etched to form the first insulating layer 210.

Additionally, during the etching of the first insulating material layer and/or second insulating material layer, the etchant may also etch away part of the remainder of the third insulating material layer within the isolation trench so that the top surface of the remainder of the third insulating material layer within the isolation trench 200a is lower than the top surface of the substrate 100.

According to this embodiment, during the etching of the first insulating material layer, the etchant may also remove part of the remainder of the third insulating material layer within the isolation trench so that top surfaces of the portions of the third and first insulating material layers remaining in the isolation trench 200a are both lower than the top surface of the substrate 100, resulting in the formation of the third insulating layer 230 and the first insulating layer 210.

In other words, according to this embodiment, the top surfaces of the first and third insulating layers 210, 230 are both below a top surface of the second insulating layer 220. As a result, the second insulating layer 220 delimits a first groove 200b in the isolation trench 200a. Moreover, side surfaces of the second insulating layer 220 and the isolation trench 200a delimit second grooves 200c.

Further, it is to be noted that, for example, at least two of the trench isolation structures 200 may be formed in the substrate 100, of which every two adjacent trench isolation structures 200 define an active area (AA) in which semiconductor components can be formed as desired in subsequent processes.

Figure 3C:
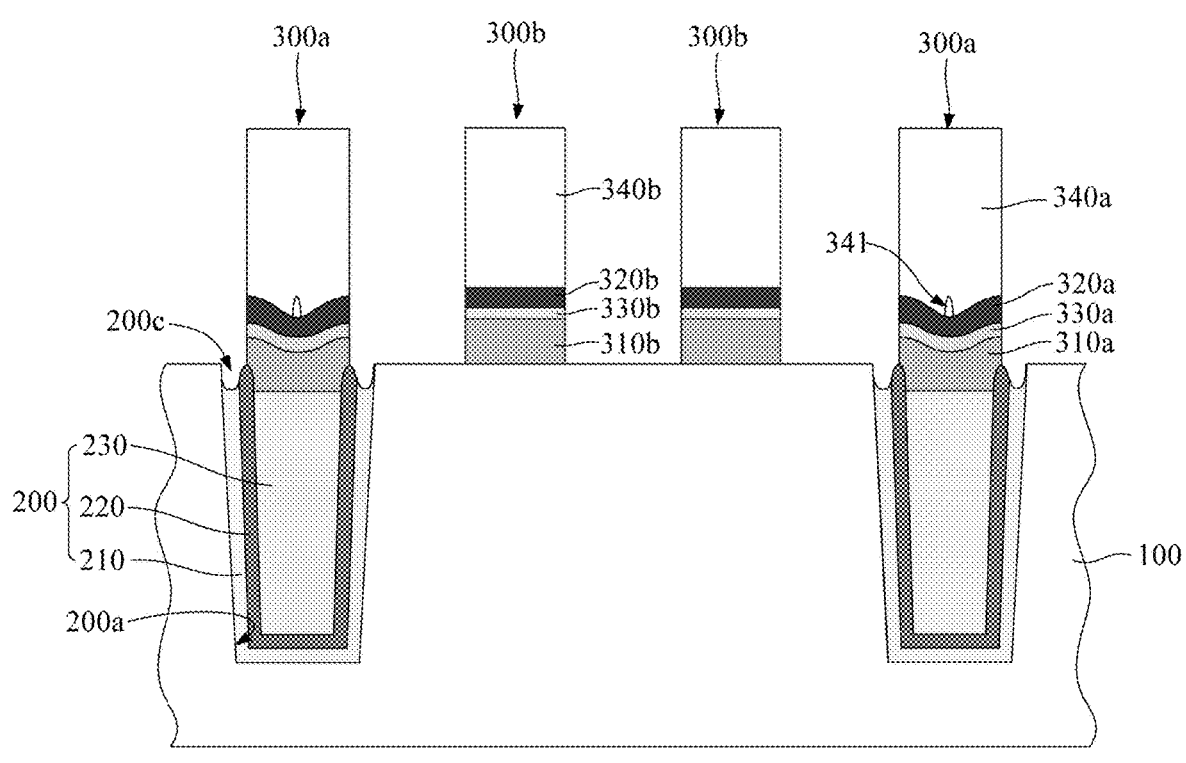

In step S300, with particular reference to FIG. 3c, a first conductive layer 310a and a second conductive layer 320a are formed over the substrate 100. Side surfaces of the first conductive layer 310a serving as lateral boundaries thereof may be situated between respective boundaries of the first groove 200b and respective boundaries of the isolation trench 200a so that the first conductive layer 310a fills up the first groove 200b, with an upper portion thereof extending upward beyond the isolation trench 200a. The second conductive layer 320a may reside on the first conductive layer 310a. The first conductive layer 310a and the second conductive layer 320a may constitute an electrically conductive structure 300.

Additionally, a projected area of the second conductive layer 320a in its height-wise direction may be not smaller than the area of a top surface of the first conductive layer 310a. According to this embodiment, side surfaces of the second conductive layer 320a serving as lateral boundaries thereof coincide with respective side surfaces of the first conductive layer 310a serving as lateral boundaries thereof.

According to this embodiment, the electrically conductive structure may have a portion residing on the trench isolation structure 200 and may function as a dummy gate structure 300a.

In an alternative embodiment, concurrently with the formation of the electrically conductive structure (dummy gate structure 300a) on the trench isolation structure 200, another electrically conductive structure functioning as a gate structure 300b may also be formed in the active area. Specifically, the simultaneous formation of the dummy gate structure 300a and the gate structure 300b may include the following steps, for example.

In a first step, a first conductive material layer is deposited on the substrate 100. According to this embodiment, the first conductive material layer not only covers the substrate portion corresponding to the active area, but also covers the trench isolation structure 200 and fills up the first groove 200b.

A top surface portion of the first conductive material layer corresponding with the first groove 200b defines a first recess with a bottom located above top edges of the isolation trench 200a. As a result, a top surface portion of the first conductive material layer corresponding with the active area is flatter than its top surface portion corresponding with the isolation area.

In a second step, a second conductive material layer is deposited on the first conductive material layer.

Likewise, the second conductive material layer covers both the active area and the isolation area (i.e., the trench isolation structure), and the bottom surface portion of the second conductive material layer corresponding with the first recess may be convex toward the first conductive material layer. The top surface portion of the second conductive material layer corresponding with the first recess may be concave toward the first conductive material layer to define a second recess.

In addition, prior to the deposition of the second conductive material layer, a third conductive material layer may be deposited on the first conductive material layer. Moreover, the second conductive material layer may be formed on the third conductive material layer.

Further, subsequent to the deposition of the second conductive material layer, a capping material layer may be formed on the second conductive material layer. In particular, the formation of the capping material layer may involve a planarization process for making a top surface of the capping material layer flatter than the top surface of the second conductive material layer. In other words, top surface portions of the capping material layer corresponding respectively with the isolation and active areas are flush with each other.

Furthermore, according to this embodiment, since the portion of the second conductive material layer corresponding with the isolation area defines the second recess, a void may be formed in a portion of the capping material layer corresponding with the second recess.

In a third step, stacks of second and first conductive layers are formed by patterning the second and first conductive material layers. Specifically, the patterning of the second and first conductive material layers may include the following steps, for example.

At first, a patterned mask layer may be formed on the second conductive material layer. According to this embodiment, the mask layer is formed on the capping material layer, and the pattern formed therein includes features respectively defining the dummy gate structure in the isolation area and the gate structure in the active area.

Next, using the mask layer as a mask, the second and first conductive material layers may be etched to form the stacks of second and first conductive layers. According to this embodiment, masking layers and third conductive layers may also be formed by etching the capping material layer and the third conductive material layer using respective mask layers as respective masks. As discussed above, the top surface portion of the capping material layer corresponding respectively with the isolation and the active areas are located within the same plane. Accordingly, the resulting masking layers respectively over the isolation and active areas may also have their top surfaces coplanar with each other.

With particular reference to FIG. 3c, in each of the isolation area (an area corresponding to the trench isolation structure) and the active area, a stack of the first conductive layer, the third conductive layer, the second conductive layer and the masking layer is formed. The first conductive layer 310a, the third conductive layer 330a, the second conductive layer 320a and the masking layer 340a in the isolation area constitute the dummy gate structure 300a, while the first conductive layer 310b, the third conductive layer 330b, the second conductive layer 320b and the masking layer 340b constitute the gate structure 300b.

According to this embodiment, the dummy gate structure 300a fills up the first groove 200b in the isolation trench 200a, and its side surfaces serving as lateral boundaries of the dummy gate structure 300a come into contact with the second insulating layer 220. In other words, the dummy gate structure 300a does not fill the second grooves 200c in the isolation trench 200a.

In other embodiments, the method of fabricating a semiconductor structure may further include, in step S400, forming a spacer structure.

Figure 3D:
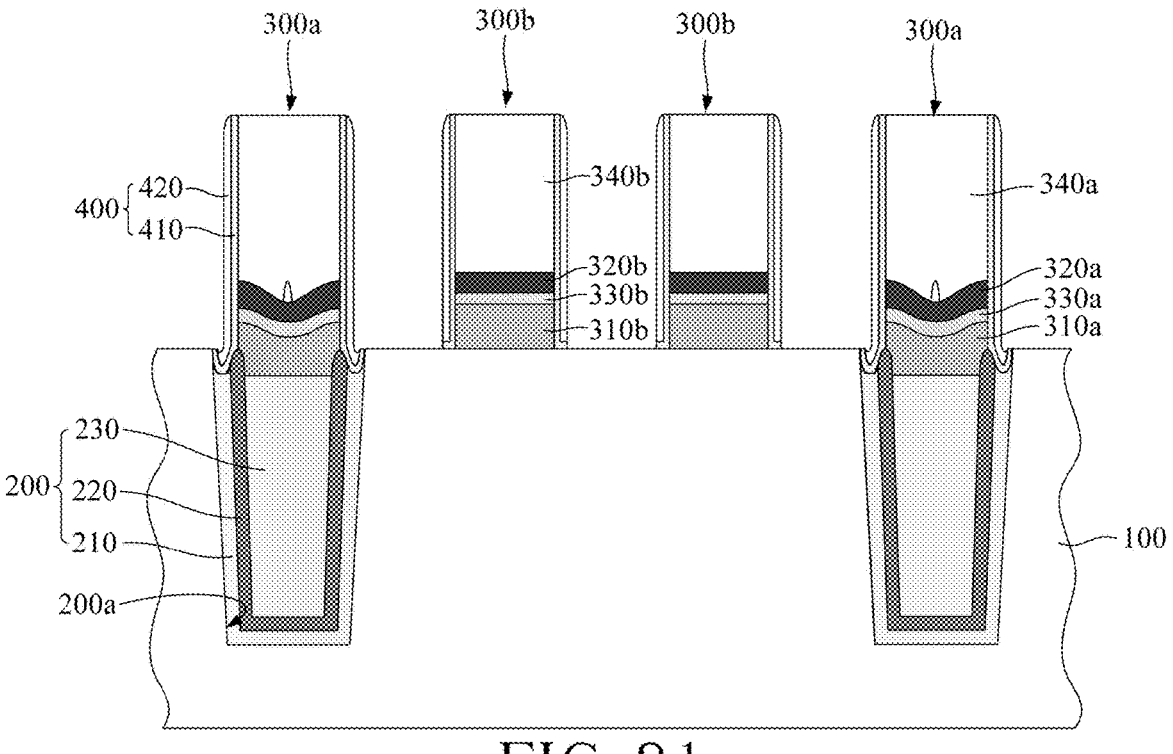

With particular reference to FIG. 3d, the spacer structure 400 may cover at least the side surface portions of the first conductive layer 310a extending upward beyond the isolation trench and side surfaces of the second conductive layer 320a. In addition, the spacer structure 400 may further extend into and fill up the second grooves.

As shown in FIG. 3d, according to this embodiment, each of the dummy gate structure 300a and the gate structure 300b is formed with such a spacer structure 400 on the side surfaces, thereby covering the side surfaces of the first, third and second conductive layer 310b, 330b, 320b in the gate structure 300b.

In this way, the gate structure 300b in the active area and the dummy gate structure 300a in the isolation area can be formed in the same processing step, as well as the spacer structures 400 over the side surfaces of the gate structure 300b and the dummy gate structure 300a, facilitating simplification of the process.

In summary, in the semiconductor structure according to this embodiment, through forming the electrically conductive structure at least partially on the trench isolation structure, a space above the trench isolation structure can be efficiently utilized, which means that the electrically conductive structure requires the occupation of a reduced space in a semiconductor integrated circuit in which the semiconductor structure is employed. This is helpful in miniaturization of the semiconductor integrated circuit.

In alternative embodiments, the electrically conductive structure functioning as the dummy gate structure may have a width smaller than an opening size of the isolation trench so that the dummy gate structure does not cross talk with any semiconductor component (e.g., the gate structure) formed in the active area.

In other embodiments where the trench isolation structure is fabricated from multiple insulating material layers, these insulating material layers may be processed using a single etching process which takes advantage of different etching rates of the insulating materials to create one or more height differences between top surfaces of the resulting insulating layers (e.g., according to this embodiment, there is a height difference between the top surfaces of the first and second insulating layers). Additionally, since the electrically conductive structure in the isolation area does not extend to boundaries of the isolation trench along a predetermined direction (e.g., a width-wise direction of the electrically conductive structure), the second grooves delimited in the isolation trench by side surface portions of the second insulating layer and the isolation trench are not filled by the electrically conductive structure. On the basis of this, the spacer structure covering the side surfaces of the electrically conductive structure may extend into the second grooves to eliminate the gaps around edges of the isolation trench, thus ensuring good isolation performance of the trench isolation structure.

It is to be noted that, in the conventional practice of forming a trench isolation structure by means of planarization, when the trench isolation structure includes multiple insulating material layers, it is necessary to employ different planarization processes for different insulating materials, making the process tedious. Therefore, compared with the conventional practice, the process according to this embodiment is simplified while ensuring good isolation performance of the resulting trench isolation structure.

It is noted that while the invention has been described with reference to several preferred embodiments, it is not intended to be limited to these embodiments in any way. In light of the above teachings, any person of skill in the art may make various possible variations and changes to the subject matter of the present invention or modify it to equivalent alternatives without departing from the scope of the invention. Accordingly, any and all such simple variations, equivalent alternatives and modifications made without departing from the scope of the invention are intended to fall within this scope.

It is also noted that the terms "first", "second", "third" and the like as used herein are only intended to distinguish between various components, elements, steps, etc. rather than implying any logical or ordinal relationship among them, unless otherwise specified or indicated. In addition, the word "or" should be understood as having the definition of a logical "or" rather than that of a logical "exclusive or" unless the context clearly necessitates otherwise.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor structure, comprising:

forming a trench isolation structure in an isolation trench in a substrate, wherein at least part of a top surface of the trench isolation structure is lower than a top surface of the substrate;

forming an electrically conductive structure over the trench isolation structure in the substrate and filling the isolation trench, the electrically conductive structure comprising a first conductive layer and a second conductive layer, the first conductive layer filling the isolation trench and extending beyond the isolation trench, the second conductive layer formed on the first conductive layer, each of the first and second conductive layers having a top surface portion that is in correspondence with the isolation trench and defines a recess; and forming a masking layer on the second conductive layer of the electrically conductive structure, wherein a portion of the masking layer corresponding with the recess in the second conductive layer delimits a void with the recess in the second conductive layer.

2. The method of forming a semiconductor structure of claim 1, wherein forming the trench isolation structure comprises:

successively depositing a first insulating material layer and a second insulating material layer over the substrate so that the first and second insulating material layers sequentially cover both an inner surface of the isolation trench and the top surface of the substrate;

depositing a third insulating material layer over the substrate, the third insulating material layer covering the second insulating material layer and filling the isolation trench; and performing an etching process to etch the third, second and first insulating material layers to remove portions of the third, second and first insulating material layers formed above the top surface of the substrate so that remainders of the third, second and first insulating material layers within the isolation trench constitute respective third, second and first insulating layers.

3. The method of forming a semiconductor structure of claim 2, wherein during etching of the second insulating material layer and the first insulating material layer in the etching process, an etchant also etches away a portion of the third insulating material layer in the isolation trench, and a top surface of the third insulating material is lower than a top surface of the second insulating layer to define a groove above the third insulating layer.

4. The method of forming a semiconductor structure of claim 3, wherein forming the electrically conductive structure comprises:

depositing a first conductive material layer on the substrate, the first conductive material layer covering the trench isolation structure and filling in the groove;

depositing a second conductive material layer on the first conductive material layer, wherein the second conductive material layer is curved toward the first conductive material layer; and patterning the second and first conductive material layers to form laminated second and first conductive layers.

5. A method of forming a semiconductor structure, comprising:

providing a substrate and forming an isolation trench in the substrate;

forming a plurality of insulating layers in the isolation trench to form a trench isolation structure, wherein a top surface of an innermost layer of the plurality of insulating layers is lower than a top surface of the substrate so that a first groove is defined in the isolation trench; and forming a first conductive layer and a second conductive layer over the substrate to form an electrically conductive structure, wherein the first conductive layer completely fills the first groove and extends upward beyond the isolation trench, and a middle layer of the plurality of insulating layers partially covers a sidewall of the first conductive layer, and, wherein the second conductive layer is formed on the first conductive layer.

6. The method of forming a semiconductor structure of claim 5, wherein a boundary of a side surface of the first conductive layer is located between a boundary of the first groove and a boundary of the isolation trench.

7. The method of forming a semiconductor structure of claim 5, wherein forming the trench isolation structure comprises:

successively depositing a first insulating material layer and a second insulating material layer over the substrate so that the first and second insulating material layers sequentially cover both an inner surface of the isolation trench and the top surface of the substrate;

depositing a third insulating material layer over the substrate, the third insulating material layer covering the second insulating material layer and filling the isolation trench; and performing an etching process to etch the third, second and first insulating material layers to remove portions of the third, second and first insulating material layers formed above the top surface of the substrate so that remainders of the third, second and first insulating material layers within the isolation trench constitute respective third, second and first insulating layers.

8. The method of forming a semiconductor structure of claim 7, wherein during etching of the second insulating material layer and/or the first insulating material layer in the etching process, an etchant also etches away a portion of the third insulating material layer in the isolation trench so that a top surface of the third insulating material is lower than a top surface of the second insulating layer and thus that the second insulating layer delimits the first groove above the third insulating layer.

9. The method of forming a semiconductor structure of claim 7, wherein in the etching process, during etching of the first insulating material layer subsequent to the removal of the portion of the second insulating material layer above the top surface of the substrate, an etchant also etches away a portion of the third insulating material layer in the isolation trench so that top surfaces of the remaining portions of the first and third insulating layers in the isolation trench are both below a top surface of the second insulating layer and thus that side surfaces of the second insulating layer and the isolation trench delimit a second groove.

10. The method of forming a semiconductor structure of claim 5, wherein forming the first and second conductive layers comprises:

depositing a first conductive material layer on the substrate, the first conductive material layer covering the trench isolation structure and filling the first groove, the first conductive material layer having a top surface portion corresponding with the first groove and defining a first recess, the first recess having a bottom located above top edges of the first groove;

depositing a second conductive material layer on the first conductive material layer, the second conductive material layer having a bottom portion received in the first recess, the second conductive material layer having a top surface portion corresponding with the first recess, which is curved toward the first conductive material layer to define a second recess; and patterning the second and first conductive material layers to form laminated second and first conductive layers.

11. The method of forming a semiconductor structure of claim 5, wherein the trench isolation structure defines an active area in the semiconductor structure, wherein another electrically conductive structure is formed in the active area, concurrently with the formation of the electrically conductive structure on the trench isolation structure, and wherein the method further comprises, subsequent to the conductive layers:

forming masking layers on the conductive layers in the electrically conductive structures using a planarization process, a top surface of the masking layer on the trench isolation structure extends in a same plane with a top surface of the masking layer in the active area.

12. A method of forming a semiconductor structure, comprising:

providing a substrate and forming an isolation trench in the substrate, wherein forming the trench isolation structure comprises:

successively depositing a first insulating material layer and a second insulating material layer over the substrate so that the first and second insulating material layers sequentially cover both an inner surface of the isolation trench and the top surface of the substrate;

depositing a third insulating material layer over the substrate, the third insulating material layer covering the second insulating material layer and filling the isolation trench; and performing an etching process to etch the third, second and first insulating material layers to remove portions of the third, second and first insulating material layers formed above the top surface of the substrate so that remainders of the third, second and first insulating material layers within the isolation trench constitute respective third, second and first insulating layers, wherein in the etching process, during etching of the first insulating material layer subsequent to the removal of the portion of the second insulating material layer above the top surface of the substrate, an etchant also etches away a portion of the third insulating material layer in the isolation trench so that top surfaces of the remaining portions of the first and third insulating layers in the isolation trench are both below a top surface of the second insulating layer and thus that side surfaces of the second insulating layer and the isolation trench delimit a second groove;

forming a plurality of insulating layers in the isolation trench to form a trench isolation structure, wherein a top surface of an innermost layer of the plurality of insulating layers is lower than a top surface of the substrate so that a first groove is defined in the isolation trench; and forming a first conductive layer and a second conductive layer over the substrate to form an electrically conductive structure, wherein the first conductive layer completely fills the first groove and extends upward beyond the isolation trench, and wherein the second conductive layer is formed on the first conductive layer.

\*    \*    \*    \*    \*